United States Patent
Liu et al.

(10) Patent No.: US 12,077,879 B2
(45) Date of Patent: Sep. 3, 2024

(54) PREPARATION OF SINGLE-CRYSTAL LAYERED CATHODE MATERIALS FOR LITHIUM- AND SODIUM-ION BATTERIES

(71) Applicant: City University of Hong Kong, Hong Kong (HK)

(72) Inventors: Qi Liu, Hong Kong (HK); He Zhu, Hong Kong (HK)

(73) Assignee: City University of Hong Kong, Hong Kong (HK)

(*) Notice: Subject to any disclaimer, the term of this patent is extended or adjusted under 35 U.S.C. 154(b) by 161 days.

(21) Appl. No.: 17/881,646

(22) Filed: Aug. 5, 2022

(65) Prior Publication Data

US 2024/0044040 A1    Feb. 8, 2024

(51) Int. Cl.
*C30B 1/02* (2006.01)
*C30B 29/22* (2006.01)
(Continued)

(52) U.S. Cl.
CPC .............. *C30B 1/02* (2013.01); *C30B 29/22* (2013.01); *H01M 4/366* (2013.01); *H01M 4/505* (2013.01);
(Continued)

(58) Field of Classification Search
CPC .......... C30B 1/02; C30B 29/22; H01M 4/366; H01M 4/505; H01M 4/525; H01M 2004/012; H01M 2004/028
See application file for complete search history.

(56) References Cited

U.S. PATENT DOCUMENTS

| 11,862,794 B2* | 1/2024 | Xiao | H01M 4/525 |
| 2019/0190019 A1 | 6/2019 | Lee et al. | |
| 2023/0079339 A1* | 3/2023 | Ma | H01M 4/628 |
| | | | 429/231.95 |

FOREIGN PATENT DOCUMENTS

| CN | 110304665 A | * 10/2019 |
| CN | 111129448 A | 5/2020 |

(Continued)

OTHER PUBLICATIONS

Gao et al, Effects of Cobalt Deficiency on Nickel-Rich Layered LiNi0.8Co0.1Mn0.1O2 Positive Electrode Materials for Lithium-Ion Batteries, : ACS Appl. Mater. Interfaces 2019, 11, 982-989.*

(Continued)

*Primary Examiner* — Robert M Kunemund
(74) *Attorney, Agent, or Firm* — Idea Intellectual Limited; Margaret A. Burke; Sam T. Yip

(57) ABSTRACT

A method for preparing a high-performance single-crystal layered cathode material of formula $LiNi_xTM_{1-x}O_2$ (0.6<x<0.9, TM=one or more of Mn, Co, Fe, Zr, V, Ti) or formula $Na_{0.66}TMO_2$ (TM=one or more of Ni, Mn, Fe, Cr, and Co). Stoichiometric amounts of transition-metal salts are mixed to form a transition metal salt solution. A precipitating agent is added to the transition metal salt solution followed by co-precipitating a mixed transition metal precipitant. The mixed transition metal precipitant is mixed with a lithium precursor or a sodium precursor to form a cathode material precursor mixture. The cathode material precursor mixture is subjected to various calcining and grinding processes followed by annealing to create single crystal layered cathode material particles.

14 Claims, 33 Drawing Sheets

(51) Int. Cl.
  *H01M 4/36* (2006.01)
  *H01M 4/505* (2010.01)
  *H01M 4/525* (2010.01)
  *H01M 4/02* (2006.01)

(52) U.S. Cl.
  CPC ...... *H01M 4/525* (2013.01); *H01M 2004/021* (2013.01); *H01M 2004/028* (2013.01)

(56) References Cited

FOREIGN PATENT DOCUMENTS

| | | | |
|---|---|---|---|
| CN | 112694139 A | | 4/2021 |
| CN | 112993236 A | * | 6/2021 |
| EP | 3304624 B1 | | 7/2020 |

OTHER PUBLICATIONS

Fan et a; : Surface Modification Engineering Enabling 4.6 V Single-Crystalline Ni-Rich Cathode with Superior Long-Term Cyclability Adv. Funct. Mater. 2022, 32, 2109421.*

He Zhu et al., Spontaneous Strain Buffer Enables Superior Cycling Stability in Single-Crystal Nickel-Rich NCM Cathode, Nano Lett. 2021, 21, 9997-10005.

* cited by examiner

PREPARATION OF SINGLE-CRYSTAL LAYERED CATHODE MATERIALS FOR LITHIUM- AND SODIUM-ION BATTERIES

TECHNICAL FIELD

The present invention relates to method for making single-crystal cathode materials for lithium- and sodium-ion batteries and, in particular, to methods that can scale for commercial production.

BACKGROUND

Lithium-ion batteries (LIBs) have become a ubiquitous part of mobile devices and electric vehicles. With the increasing requirement for lithium ion batteries to demonstrate higher energy density, development efforts have gradually shifted from Co-based (i.e., $LiCoO_2$) to Ni-based cathodes (i.e., $LiNi_xCo_yMn_zO_2$, referred as NCM). In particular, Ni-rich NCM oxides (x≥0.8) are recognized as ideal candidates for high-energy density LIBs. The high content of nickel can both boost capacity via a two-electron Ni2+/4+ redox couple and reduce cost due to the replacement of the high-price cobalt component with nickel.

Despite the potential, in practice Ni-rich NCM cathodes suffer from severe capacity degradation upon cycling; this degradation turns into deterioration as the nickel content increases. The reasons for this degradation are multifold and complex; however, most reasons originate from the particle morphology. To increase packing density, conventional NCMs are prepared as polycrystalline secondary particles formed from densely packed agglomerated nanoscale primary grains. These agglomerated particles typically possess a large surface area, inevitably reacting with an electrolyte to form impeded solid-electrolyte interphase (SEI) films that eventually lead to capacity decay. In addition, driven by the migration of Ni4+, the layered surface will transform into spinel or a rock-salt phase at high voltage, accompanied by transition-metal (TM) dissolution and high-risk $O_2$ gas release. Furthermore, upon charging and discharging, the NCM lattice experiences complex transitions between three hexagonal phases (denoted as H1, H2 and H3 with space group R-3m). These transitions induce anisotropic volume change and therefore intergranular cracks, giving rise to segregated primary grains that account for interfacial impedance growth and capacity decay.

To minimize these problems, traditional approaches focus mainly on coating or doping the polycrystalline particles. Although partial success has been achieved, these approaches sacrifice energy density and introduce structural inhomogeneity.

Thus, there is a need in the art for large-scale homogeneous materials with structural superlubricity. Such low-friction materials can serve as frictionless coatings resulting in both energy savings and enhanced device functionality. The present invention addresses this need.

SUMMARY OF THE INVENTION

With the above drawbacks of polycrystalline cathode materials, recent efforts have been focused on developing micro-sized single crystal cathode materials. In contrast to their polycrystalline counterparts, single crystal cathode materials demonstrate greatly reduced surface area and eliminate grain boundaries; as a result, the solid-electrolyte interphase issues and the grain-boundary cracks may be reduced. Further, single-crystal cathode materials also exhibit favorable properties such as high compaction density, better particle-to-particle contact, and less fragility. Preferable cycling performance has been demonstrated in for single-crystal cathode materials of the formula $LiNi_xTM_{1-x}O_2$ (TM=one or more of Mn, Co, Fe, Zr, V, Ti) with lower levels of nickel content (x<0.6), for example, $LiNi_{0.33}Co_{0.33}Mn_{0.33}O_2$, $LiNi_{0.5}Co_{0.2}Mn_{0.3}O_2$, and $LiNi_{0.6}Co_{0.2}Mn_{0.2}O_2$. For single-crystal Ni-rich cathode materials, the cycling stability is rarely satisfactory due to the more profound volume change and high-voltage $Ni^{4+}$ migration.

The present invention relates to the preparation of single-crystal cathode materials such as nickel-rich $LiNi_{0.83}Co_{0.12}Mn_{0.05}O_2$ (SC-N83) cathode materials with high specific capacity and excellent cycling stability. The SC-N83 particles can prevent mechanical fractures with robust morphological integrity upon cycling in contrast to cycled polycrystalline materials (PC-N83) that exhibit cracks during repeated cycling. Apart from the morphological advantages, the single-crystal cathode materials also benefit from unique Li-(de)intercalation kinetics, exhibiting an intermediate monoclinic phase between H1-H2 transition and stacking faults within a high-voltage H3 lattice. These structural changes can enable an additional strain buffer between the SC-N83 particles that ensures the high cycling stability.

In a first aspect, the present invention provides a method for preparing a high-performance single-crystal layered cathode material of formula $LiNi_xTM_{1-x}O_2$ (0.6<x<0.9, TM=one or more of Mn, Co, Fe, Zr, V, Ti) or formula $Na_{0.66}TMO_2$ (TM=one or more of Ni, Mn, Fe, Cr, and Co). The process includes mixing together stoichiometric amounts of transition-metal salts to form a transition metal salt solution. A precipitating agent such as sodium hydroxide or ammonium hydroxide is added to the transition metal salt solution followed by co-precipitating a mixed transition metal precipitant. The mixed transition metal precipitant is mixed with a lithium precursor or a sodium precursor to form a cathode material precursor mixture. The cathode material precursor mixture is calcined at a first temperature to form a first calcined material followed by grinding of the first calcined material. The ground first calcined material is calcined at a second temperature to form a second calcined material. The second calcined material is annealed at a third temperature to create single crystal layered cathode material particles.

In a further embodiment, the mixed transition metal precipitant is washed, filtered, and dried prior to calcining.

In a further embodiment, the lithium precursor is lithium hydroxide and the sodium precursor is sodium hydroxide.

In a further embodiment, the precipitating agent is sodium hydroxide with a concentration of 4.0 mol $L^{-1}$ in an ammonium hydroxide solution having a concentration sufficient to obtain a pH approximately equal to 11.

In a further embodiment, the concentration of the transition metal solution is approximately 2.0 mol $L^{-1}$.

In a further embodiment, the transition-metal solution and the alkalis are added separately into a reaction vessel.

In a further embodiment, the transition metal precipitant is mixed with the lithium precursor or the sodium precursor at a molar ratio of 1.05:1.

In a further embodiment, the first temperature is within a temperature range of 400 to 600° C. and the second temperature is within a temperature range of 700-1000° C.

In a further embodiment, the first calcining is performed for approximately 4-6 hours and the second calcining is performed for approximately 12-17 hours.

In a further embodiment, grinding the first calcined material is performed with a ball mill at a speed of approximately 200 rpm $min^{-1}$ to 400 rpm $min^{-1}$ for approximately 2 to 4 hours.

In a further embodiment, the third temperature is approximately 600 to 900° C. and an annealing time is approximately 8 to 12 hours.

In a further embodiment, the calcining is performed in an oxygen-containing atmosphere.

In a further embodiment, a particle size of the single crystal layered cathode material particles is in a range of 2-5 µm.

DETAILED DESCRIPTION

Figures 1A, 1B, 1C, 1D, 1E:
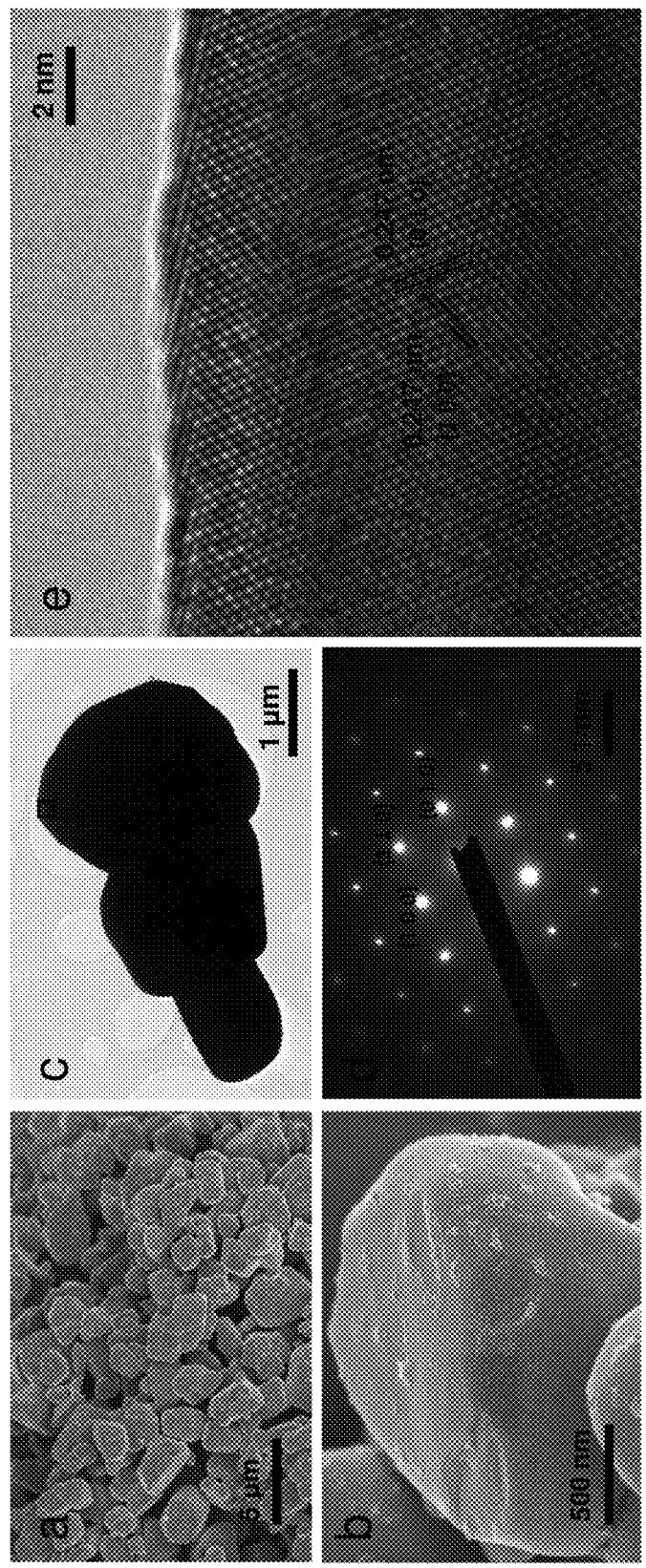
FIGS. 1a-1e show single-crystal integrity of the as-prepared Ni-rich cathode materials. (1a) Low- and (2b) are high-magnification SEM images of the as-prepared SC-N83 particles. (1c) is a low-magnification TEM image of the as-prepared SC-N83 particles. (1d) is an SAED pattern of the SC-N83 sample along the [001] zone axis fingerprinting hexagonal phase. (1e) is an HRTEM image within the yellow rectangular area in (1c).

This invention provides a facile method for preparing single-crystal layered cathode material with improved cycling stability and robust morphological integrity for the use of high-energy and high-power lithium and sodium-ion batteries. The method is easily scaled for commercial-quantity production levels. The prepared single-crystal cathode materials can deliver high initial capacity while exhibiting high cycling stability compared with conventional polycrystalline oxide cathodes. Due to the reduced surface area and elimination of grain boundaries, the single-crystal particles of the present invention maintain robust morphological integrity upon long-term cycling. In addition, the single-crystal cathode materials show unique $Li^+/Na^+$ transportation kinetics, triggering an intermediate monoclinic phase between the H1-H2 transition as well as multiple layer distances in high-voltage H3 lattice. These structural changes can be regarded as an additional strain buffer between the single crystal particles, which ensures the high cycling stability.

Apart from lithium-ion batteries, sodium-ion batteries, using sodium instead of lithium as charge carriers, shows great promises due to earth-abundant and cost-effective sodium resources. At present, layered sodium layered transition-metal (TM) oxides, $Na_xTMO_2$ (x≈0.66, TM refers to transition metals such as Ni, Mn, Fe, Cr, and Co), are widely recognized as the leading candidates of cathode materials for sodium-ion batteries.

In a first aspect, the present invention provides a method for preparing a high-performance single-crystal layered cathode material of the formula $LiNi_xTM_{1-x}O_2$ (0.6<x<0.9, TM=one or more of Mn, Co, Fe, Zr, V, Ti) or the formula $Na_{0.66}TMO_2$ (TM=one or more of Ni, Mn, Fe, Cr, and Co). The process includes mixing together stoichiometric amounts of transition-metal salts to form a transition metal salt solution. In one aspect, the transition metal salts may be metal sulfates, metal carbonates, or metal nitrates. The concentration of the transition metal solution is approximately 1.5-3.0 mol $L^{-1}$.

A precipitating agent such as sodium hydroxide or ammonium hydroxide is added to the transition metal salt solution. For example, when the precipitating agent is sodium hydroxide a concentration of 3.0 to 5.0 mol $L^{-1}$ may be used with 4.0 being preferred. Further, ammonium hydroxide may be added a concentration sufficient to obtain a pH approximately equal to 10-12 with 11 being preferred. Further, in one embodiment, the transition-metal solution and the precipitating agent are added separately into a reaction vessel.

Following addition of the precipitating agent, a mixed transition metal precipitant precipitates out of the solution. For example, when sodium hydroxide is used as the precipitating agent, the mixed transition metal precipitant includes mixed transition metal hydroxides.

The mixed transition metal precipitant is mixed with a lithium precursor or a sodium precursor to form a cathode material precursor mixture. For example, a lithium salt or lithium hydroxide may be mixed with the transition metal precipitant to form $LiNi_xTM_{1-x}O_2$; similarly, a sodium salt or sodium hydroxide may be mixed with the transition metal precipitant to form $Na_{0.66}TMO_2$. In order to compensate for lithium loss during calcining, the lithium precursor may be added at a lithium to transition metal ratio of 1.05 to 1.

The cathode material precursor mixture is calcined at a first temperature to form a first calcined material. In an embodiment, the first temperature is selected to be 400 to 600° C. with 500° C. being preferred. The first calcining time may be 4-6 hours with 5 hours being preferred.

Following this first calcining, grinding is performed to break up agglomerations. Grinding may be performed using a ball mill a speed of approximately 200 rpm $min^{-1}$ to 400 rpm $min^{-1}$ with 300 rpm $min^{-1}$ being preferred for approximately 2 to 4 hours, with 3 hours being preferred.

The ground first calcined material is calcined to form a second calcined material; the second calcining is performed at a second temperature in a range of 700-1000° C. with 880° C. being preferred. The second calcining time may range from 12-17 hours with 15 hours being preferred.

Following the second calcining, the second calcined material is annealed at a third temperature to create single crystal layered cathode material particles. The third temperature/annealing temperature is 600 to 900° C. (with 750° C. being preferred) and an annealing time is approximately 8 to 12 hours with 10 hours being preferred. An example of the formed single crystal particles is depicted in the SEM image of FIG. 1a.

Preferably, the calcination and annealing take place in an oxygen-containing atmosphere which may be range from approximately 20 percent to 100 percent oxygen. The single crystal particles formed from this process have a particle size of approximately 2 to 5 microns.

The micron-sized single crystal materials prepared by this method show high specific capacity and exhibit superior cycling stability. The single-crystal cathode materials can maintain robust morphological integrity without mechanical fractures upon cycling as will be described in further detail below in connection with the examples. The above method is robust and can be readily scaled to fabricate large volumes of single crystal particles.

Examples

A. Techniques
1. Sample Preparation:
Synthesis of SC- and PC-N83 Cathode Materials Spherical $[Ni_{0.83}Co_{0.12}Mn_{0.05}](OH)_2$ precursors were synthesized using a typical coprecipitation method. An aqueous solution containing $NiSO_4·6H_2O$, $CoSO_4·7H_2O$, and $MnSO_4·5H_2O$ with a concentration of 2.0 mol $L_{-1}$ was pumped into a continuously stirring tank reactor under $N_2$ atmosphere. At the same time, NaOH solution with a concentration of 4.0 mol $L_{-1}$ and a desired amount $NH_4OH$ solution were pumped separately into the reactor to maintain pH~11 during the reaction. Afterwards, the precursors were filtered, thoroughly washed with distilled water, and dried overnight at 110° C. LiOH was thoroughly mixed with the precursors with a molar ratio of 1.05:1. The excess lithium in the raw material was used for the compensation of lithium loss during the calcination process. After that, a two-stage calcination process was carried out—the mixture was preliminarily annealed at 500° C. for 5 h, and subsequently calcined at 880° C. for 10 h in oxygen atmosphere. The obtained cathode material was ground by ball milling for 4 h with a speed of 300 rpm $min^{-1}$. The ground material was calcined again at 750° C. for 10 h and the SCN83 was prepared. By comparison, the PC-N83 cathode material was prepared by mixing LiOH and transition metal precursors with a molar ratio of 1.02:1, and then the mixture was calcined at 800° C. for 10 h.

2. Electrochemical Measurements
Electrochemical Measurements

The PC-N83 and SC-N83 electrodes were prepared by mixing 80 wt. % active materials, 10 wt. % super P and 10 wt % poly (vinylidene fluoride) (PVDF) uniformly in a solvent of N-methyl-2-pyrrolidone. The uniform slurry was placed on an Al foil current collector before being dried at 90° C. in vacuum for 12 h. The mass loading of the active material per electrode was about 4 mg $cm^{-2}$. Then the electrodes were assembled to 2032 coin-type cells in an argon-filled glovebox using lithium metal as the counter electrode. The electrolyte used in the coin cells was 1.2 M $LiPF_6$ in ethylene carbonate ethyl methyl carbonate (3:7, vol %) with 2 wt % vinylene carbonate (VC).

Figure 9A:
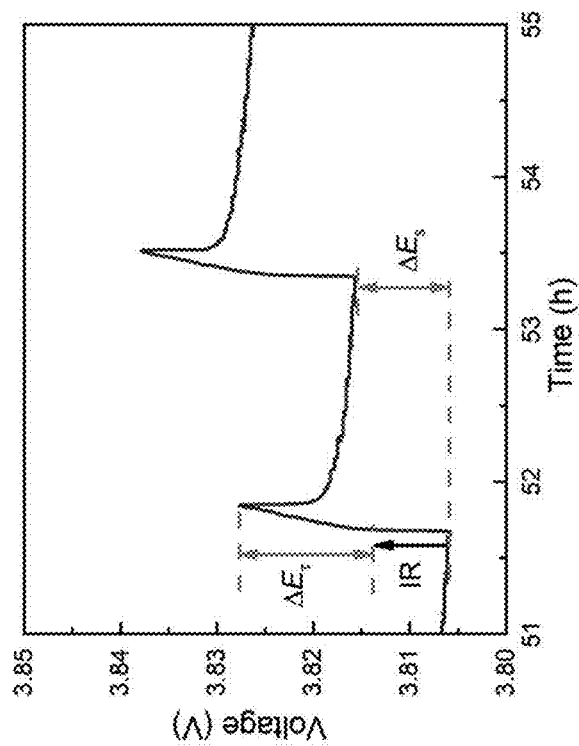
FIGS. 9a-9c show (9a) Amplified voltage response within one single current pulse. Calculated Li+ diffusion coefficients of PC- and SC-N83 cathodes at (9b) charge and (9c) discharge process.

The cells were charged and discharged between 2.8 V and 4.3 V at different rates (1 C=190 mAh $g_{-1}$) on a NEWARE battery test system at room temperature. The EIS tests were conducted by using an amplitude of 5 mV in the frequency range of 0.01 Hz and 1 MHz. The temperature of the EIS testing was controlled by an Ivium-n-Stat multichannel electrochemical analyzer. The EIS plots are fitted according to the equivalent circuit. The first circle in the high frequency is related to the resistance for the migration of lithium ions through the surface film ($R_f$), while the second one in the low frequency is attributed to the charge transfer resistance ($R_{ct}$). The temperature-dependent $R_{ct}$ follows the Arrhenius equation described as:

$$1/R_{ct} = A \exp(-E_a/RT)$$

where A is the frequency factor, $E_a$ is the activation energy, R is the gas constant, and T is the absolute temperature. The GITT measurements were conducted to evaluate the $Li_+$ diffusion coefficients ($D_{Li^+}$) based on the Fick's second law of diffusion. The equation for the $D_{Li^+}$ calculation can be written as below:

$$D_{Li^+} = \frac{4}{\pi\tau}\left(\frac{m_B V_M}{M_B A}\right)^2 \left(\frac{\Delta E_S}{\Delta E_\tau}\right)^2$$

where $m_B$, $V_M$, $M_B$ and A are the mass, the molar volume, the molecular weight, and the interface area of the electrode material, respectively. The calculation of $\Delta E_s$ and $\Delta E_t$ is shown in FIG. 9a.

3. Sample Characterizations

The powder XRD measurements were performed using a Smart Lab diffractometer (Rigaku Corporation, Tokyo, Japan), equipped with a Cu Kα radiation (λ=1.54186 Å) and a HyPix-3000 detector. The collected XRD patterns were refined based on the Rietveld method using Fullprof software. The backgrounds were subtracted by linear interpolation and the peak shapes were described using a pseudo-Voigt profile function.

The SEM images were taken by a JSM-7800F field emission scanning electron microscope (FESEM) operated at an acceleration voltage of 20 kV, while the TEM and HRTEM images were taken on a JEOL JEM-2100 equipment operated at 200 keV. For the in situ lab XRD test, a specially designed cell with an Al window and an Al current collector was used for the first cycle. To ensure high-rate measurement, every scan was collected in 0.02° increments between 10° and 55° at a scanning speed of 0.18° per second.

4. Collection and Analysis of In Situ Synchrotron XRD

The in situ XRD experiments were carried out using the 11-ID-C beamline at Advanced Photon Source (APS) of Argonne National Laboratory (ANL), with the X-ray wavelength 0.1173 Å. A Si (113) single crystal was employed as the monochromator for an X-ray beam at 105.7 keV. The in situ XRD data was collected using Argonne's multipurpose in situ X-ray (AMPIX) cell. The cathode pellet was prepared by mixing the SC-N83 powders with super-P carbon and PVDF binder uniformly in a weight ratio of 6:2:2 in ~2 mL of N-methyl-2-pyrrolidone, and this pellet was mounted in the AMPIX cell with Li metal as the anode. The electrolyte used in the coin cells was 1.2 M $LiPF_6$ in ethylene carbonate-ethyl methyl carbonate (3:7, vol %) with 2 wt % vinylene carbonate (VC).

In a typical in situ collection, a single XRD pattern was obtained in the transmission geometry with a Perkin-Elmer two-dimensional detector during a time period of 30 seconds. The obtained 2D patterns were calibrated with a standard sample of $CeO_2$, and then integrated into 1D patterns using the Fit2D software. The lattice parameters were extracted from the integrated XRD patterns using Fullprof software.

5. Collection and Analysis of In Situ PDF of Synchrotron X-Ray Total Scattering

An AMPIX cell was used for the in situ PDF collection with the fabrication as described above. The collection of raw scattering data was similar to that of in situ XRD, except that the sample-to-detector distance is closer for a high value of momentum transfer ($Q_{max}$~20.6 Å). The collected 2D scattering images were reduced to one-dimensional data using Fit2D software. The resultant one-dimensional data was corrected with PDFgetX3 software for the background and Campton scatterings, and to compute the G(r) functions, $G(r)=4\pi r[\rho(r)-\rho_o]$, where $\rho(r)$ and $\rho_o$ are the local and average atomic number densities, by Fourier transform. The PDF refinements were carried out against the relevant structure models using PDFgui software.

B. Results

1. Microscopy

Figure 6A:
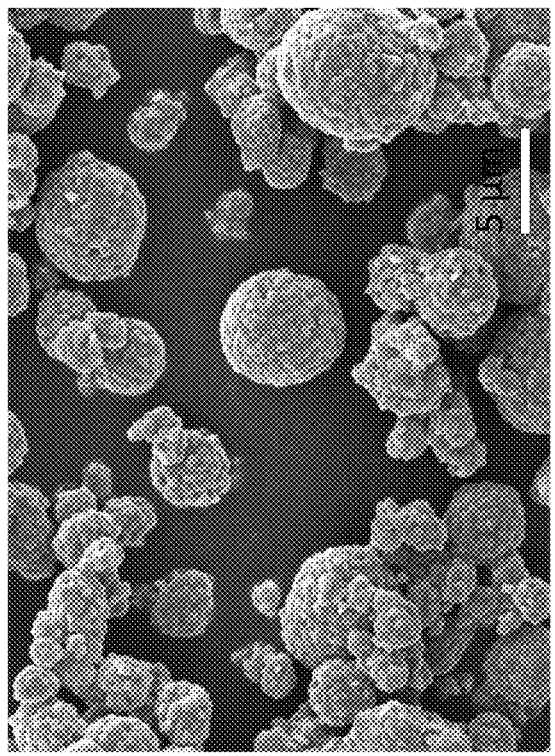
FIGS. 6a-6b are SEM images showing the morphology of polycrystalline N83 particles
Figure 6B:
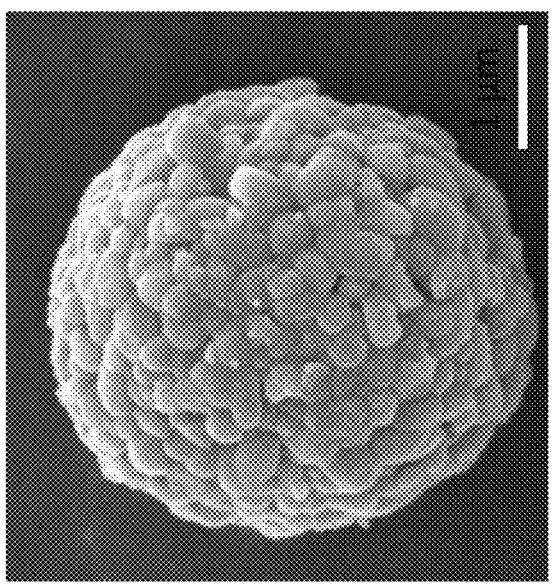

From the scanning electron microscopy (SEM) and transmission electron microscopy (TEM) images (FIGS. 1a-c), the as-prepared SC-N83 particles show an angular morphology with a particle size ranging from approximately 2 to 5 μm. The diffraction spots in the selected area electron diffraction (SAED) pattern could be separately assigned to (100), (010), and (110) planes along [001] zone axis of a hexagonal R-3m structure (FIG. 1d). FIG. 1e presents high-resolution TEM (HRTEM) image of the SC-N83 particle. Clear lattice fringes with an interplanar distance of 0.247 nm can be distinguished, which corresponds to the degenerate (100) and (010) planes. On the other hand, the PC-N83 was prepared based on a traditional coprecipitation method. The SEM images reveal that the polycrystalline particles are agglomerated by primary grains with a grain size of hundreds of nanometers (FIGS. 6a-6b).

2. X-Ray Diffraction

Figure 2A:
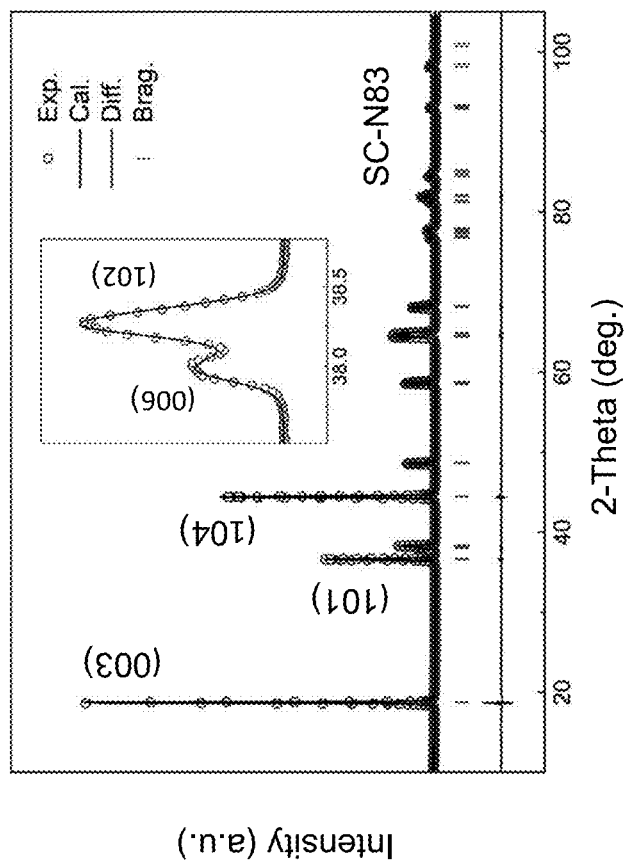
FIGS. 2a-2d show crystal structures of the single crystal (SC) and polycrystalline (PC) samples. Rietveld refinement patterns of (2a) SC- and (2b) PC-N83 powders. The insets show the well-split (006) and (102) Bragg peaks. (2c) is a low-r PDF pattern corresponding to the first two-shell atom pairs. The inset shows the schematic diagram of the refined edge-sharing TMO6 octahedral configuration. (2d) shows a full-profile refinement pattern of the SC-N83 PDF data.
Figure 2B:
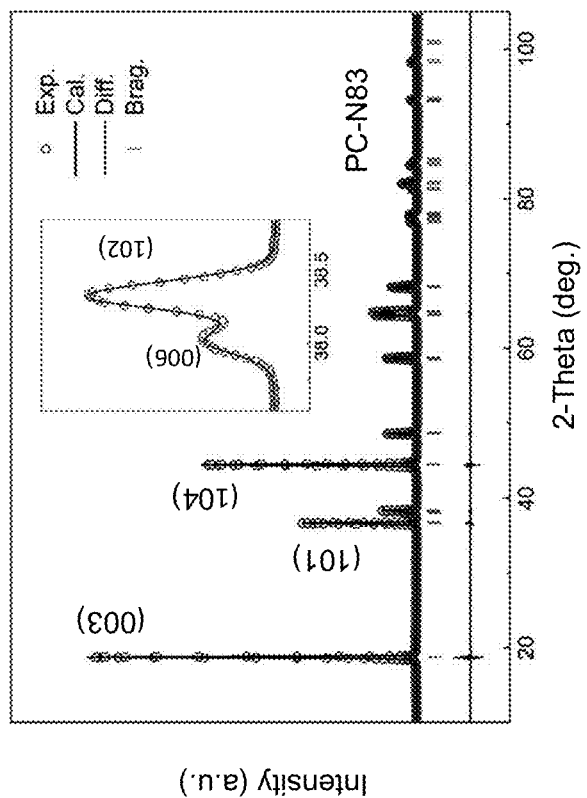
Figure 2C:
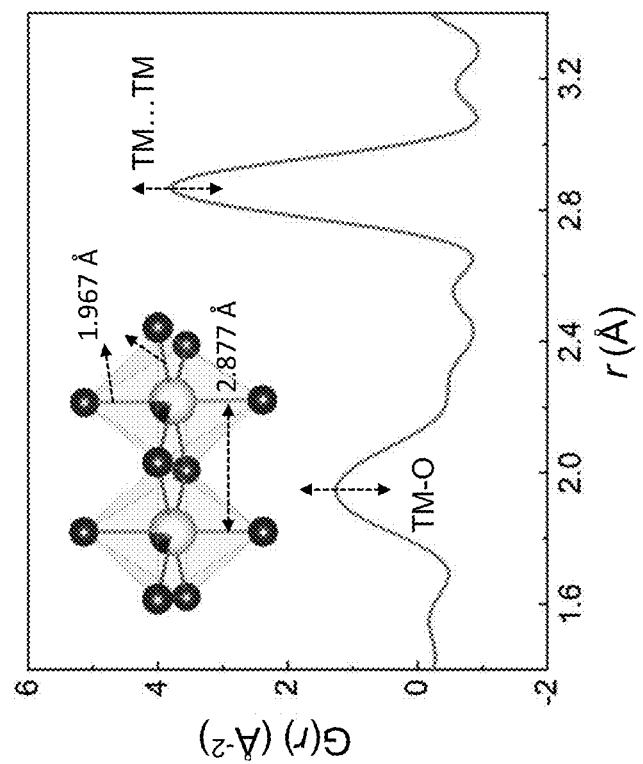
Figure 2D:
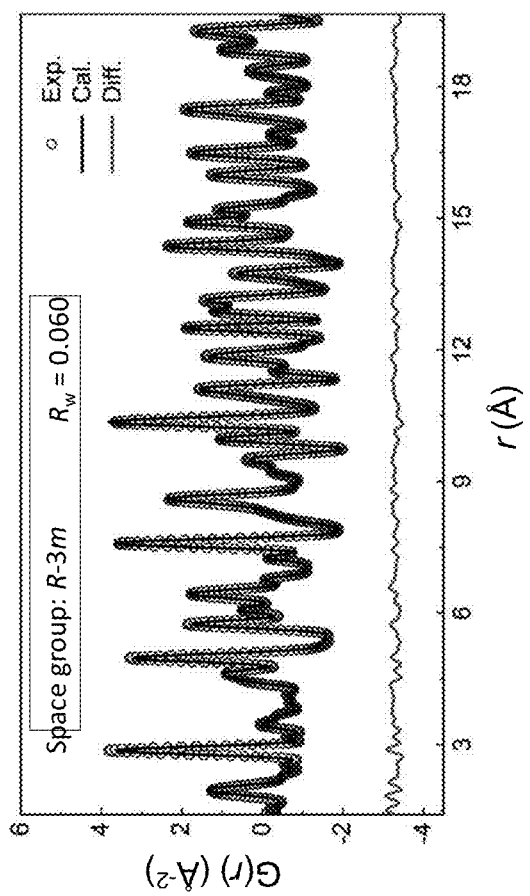

As shown in FIGS. 2a and 2b, the characteristic peaks of both patterns accord well with the hexagonal R-3m structure, and the well-split (006) and (102) peaks indicate their highly ordered layered structure. The I003/I104 intensity ratios are larger than 1.2 (i.e., ~1.58 for SC-N83 and ~1.50 for PC-N83), suggesting little Li/Ni intermixing. Accordingly, Rietveld refinements were performed based on the standard R-3m model. It is revealed that the lattice parameters of the SC-N83 sample are slightly larger than those of the PC-N83 (Table 1). For a further step, the bonding geometry of SC-N83 was studied by pair distribution function (PDF) analysis, which has been recognized to be more sensitive to short-range local structure. The typical R-3m structure is composed of edge-sharing octahedra chains in the ab plane in which all six TM-O bonds are equal in length. In the low-r PDF region (FIG. 2c), the first peak at ~1.97 Å corresponds to the octahedral TM-C bonds, whereas the second peak at ~2.88 Å is related to the nearest TM . . . TM distance. On the basis of the full-profile refinement results (FIG. 2d and Table 2), the exact TM-O bond length is 1.967 Å whereas the distance between the nearest TMs is 2.877 Å.

TABLE 1

| Samples | a/Å | c/Å | c/a | V/Å³ | $I_{003}/I_{104}$ | $R_{wp}$ |
|---------|-----|-----|-----|------|-------------------|----------|
| SC-N83 | 2.87605 (1) | 14.2029 (1) | 4.9383 (1) | 101.742 (1) | 1.577 | |
| PC-N83 | 2.87477 (1) | 14.1977 (1) | 4.9387 (1) | 101.614 (1) | 1.498 | 4.48 |

TABLE 2

| Atoms | x | y | z | Occ. |
|-------|---|---|---|------|
| Li | 0 | 0 | 0.5 | 1.0 |
| Ni | 0 | 0 | 0 | 0.83 |
| Co | 0 | 0 | 0 | 0.12 |
| Mn | 0 | 0 | 0 | 0.05 |

TABLE 2-continued

| Atoms | x | y | z | Occ. |
|---|---|---|---|---|
| O | 0 | 0 | 0.259 (1) | 1 | a (Å) = 2.877 (2),
c (Å) = 14.21 (2)

Figure 3A:
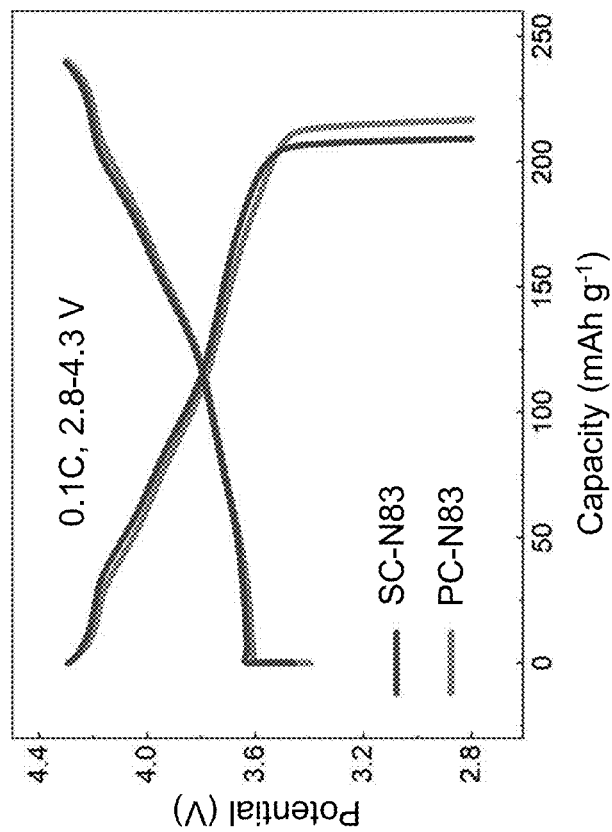
FIGS. 3a-3h show the electrochemical performance of the SC- and PC-N83 electrodes. (3a) shows charge-discharge profiles of the initial cycle for the PC- and SCN83 cathodes at the current of 0.1 C. (3b) shows the capacity retentions for the PC- and SC-N83 cathodes cycled at 1 C. The black dashed line emphasizes the retention after 100 cycles. (3c and 3d) show charge-discharge profiles at different cycles for the PC- and SC-N83 cathodes, respectively. The dashed arrows indicate the trends from the first to the 200th cycles. (3e) shows the rate capabilities of the PC- and SC-N83 cathodes. (3f and 3g) are dQ/dV curves of the PC- and SC-N83 cathodes, respectively. The dashed arrows indicate the trends from the first to the 200th cycles. (3h) is a summary of electrochemical performance in terms of initial capacity and capacity retention for previously reported single-crystal NCM cathodes in comparison to those of SC-N83.
Figure 3B:
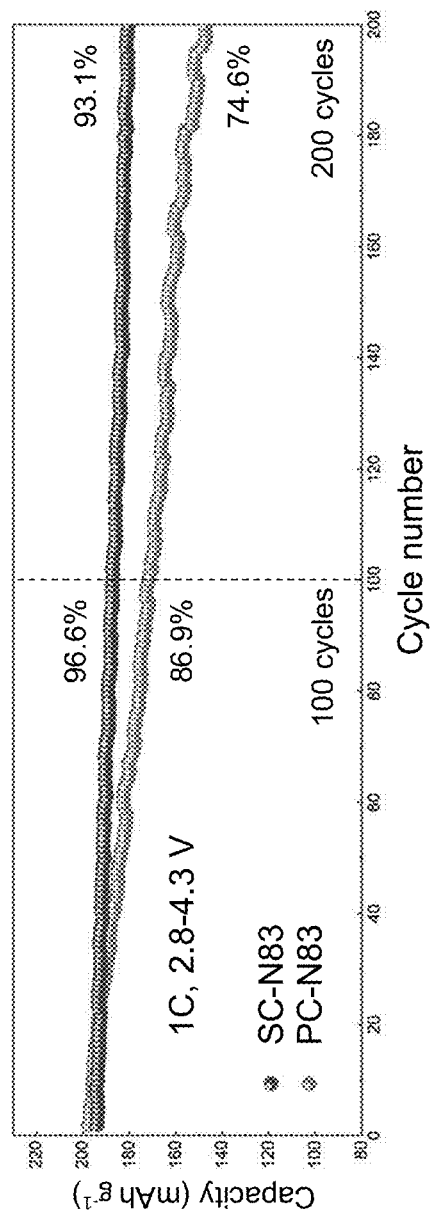
Figure 3C:
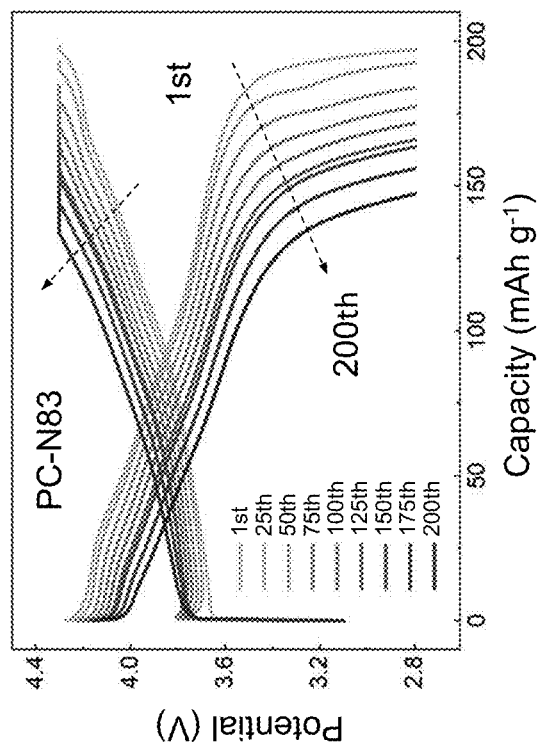
Figure 3D:
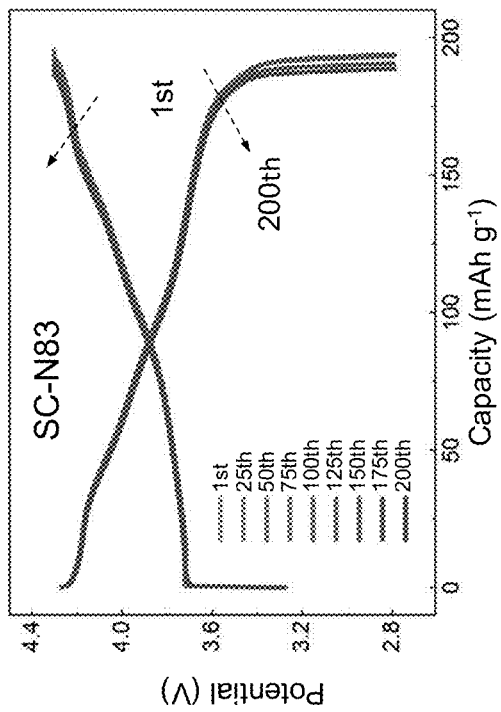
Figure 7A:
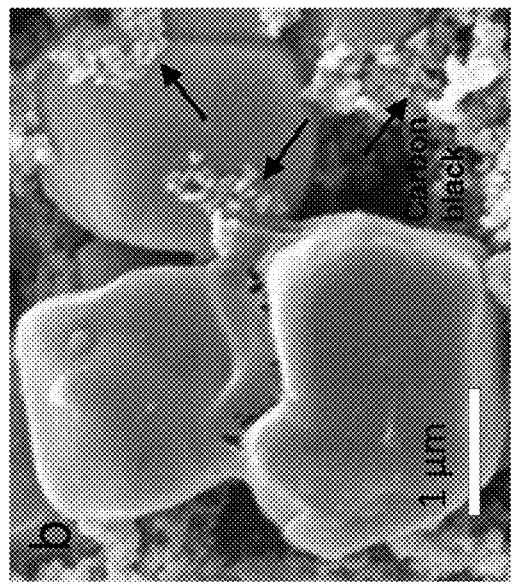
FIGS. 7a-7b show SEM images comparing polycrystalline N83 after 200 cycles to single crystal N83 particles after 200 cycles
Figure 7B:
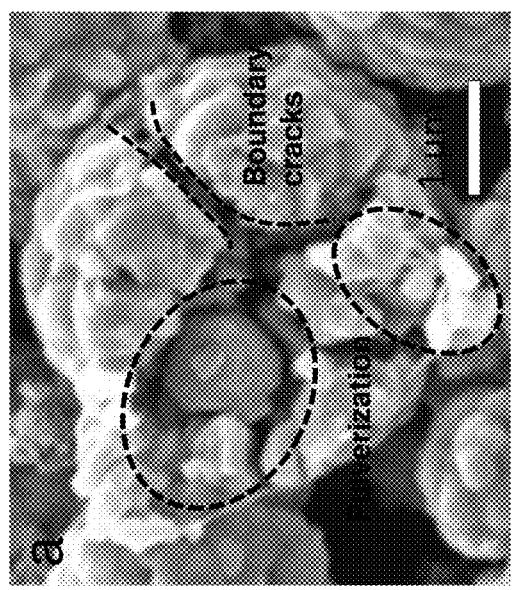
Figure 8A:
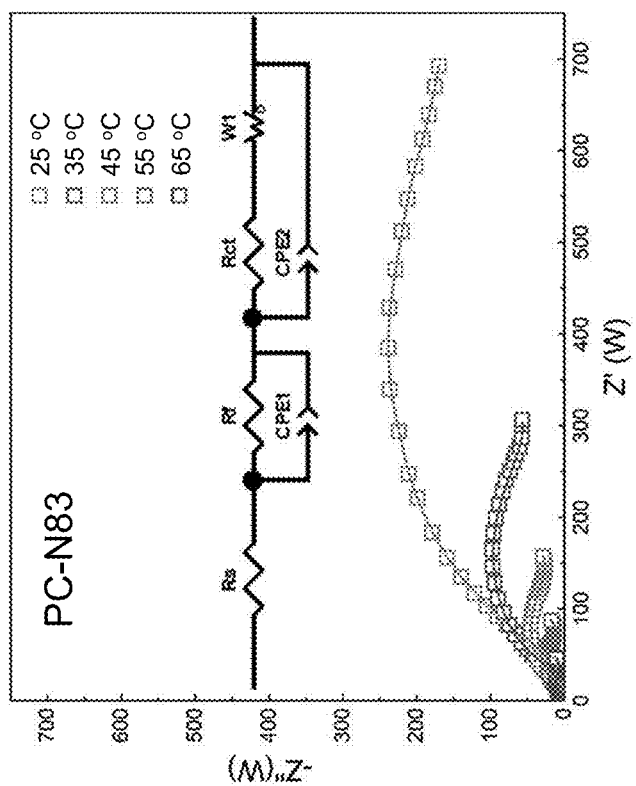
FIGS. 8a-8c depict (8a) EIS plots of the PC-N83 and (8b) SC-N83 samples after running 200 cycles at variable temperatures. The insets are the equivalent circuit models to describe the EIS plots. (8c) Temperature dependencies of Rct for the PC- and SC-N83 electrodes after 200 cycles.
Figure 8B:
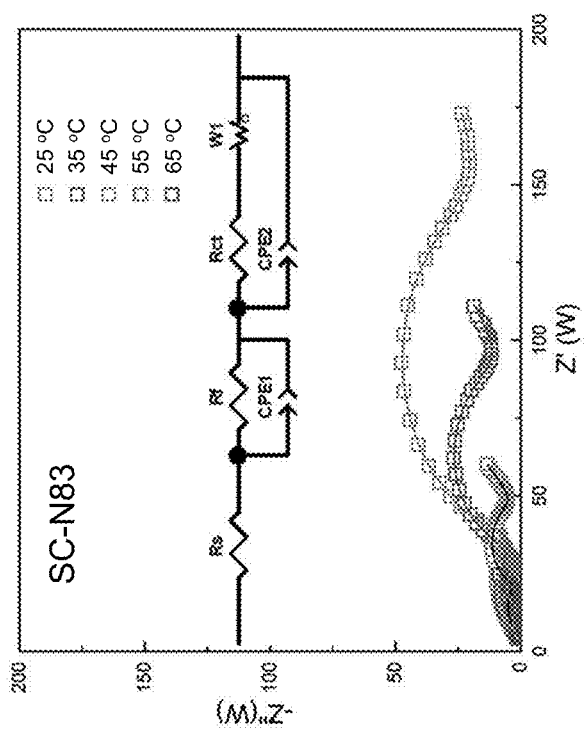
Figure 8C:
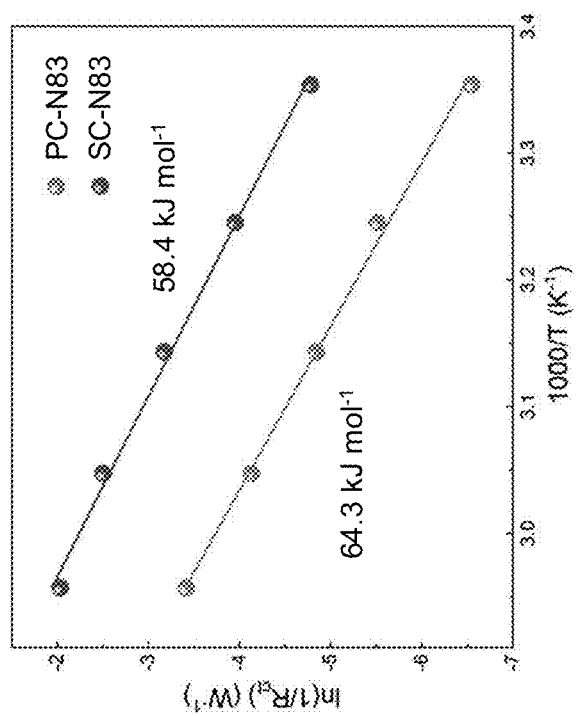

3. Electrochemical Tests:

The electrochemical tests were carried out within the voltage range from 2.8 to 4.3 V (vs Li/Li+). Benefiting from the high Ni content, both of the cathodes can deliver high discharge capacities at 0.1 C (FIG. 3a). The slightly lower initial capacity for the SC-N83 could be impaired by the longer ionic diffusion pathway in the single crystals. However, the cycling stability of these two materials shows a critical distinction (FIG. 3b): while the capacity of PC-N83 drops rapidly to 74.6% over 200 cycles, the capacity of SC-N83 is well-retained (i.e., 96.6% after 100 cycles and 93.1% after 200 cycles). Along with the superior capacity retention, the SC-N83 cathode also holds remarkable voltage stability upon cycling, as exhibited in the charge-discharge profiles at variable cycles (FIG. 3c, FIG. 3d). After 200 cycles, the voltage decay of PC-N83 is 0.1634 V, whereas that of SC-N83 is negligible (0.0177 V). The much improved cycling stability of the SC-N83 cathode may result from robust morphological integrity of single crystals, as demonstrated by SEM images of PC- and SC-N83 particles after 200 cycles (FIG. 7). The cycled PC-N83 particles display obvious cracks and even pulverize into segregated grains (FIG. 7a). These mechanical fractures certainly increase the electrode impedance. By contrast, the cycled SC-N83 particles exhibit well-maintained angular morphology without visible fractures (FIG. 7b), which ensures close contact between single crystals and therefore a highly stable cycling performance. The electrochemical impedance spectra (EIS) also validate the smaller impedance and morphological integrity of cycled SC-N83 (see room-temperature EIS in FIGS. 8a, 8b). Moreover, by conducting temperature-dependent EIS, the activation energy (Ea) of charge-transfer resistance (Rct) could be calculated based on the Arrhenius equation. The results show that the PC-N83 cathode (Ea=64.3 kJ mol-1) exhibits a higher energy barrier of charge transfer compared with the SC-N83 (Ea=58.4 kJ mol-1) after 200 cycles (FIG. 8c), which could be related to higher impedance of the cycled PC-N83 electrode induced by mechanical fractures.

Figure 3E:
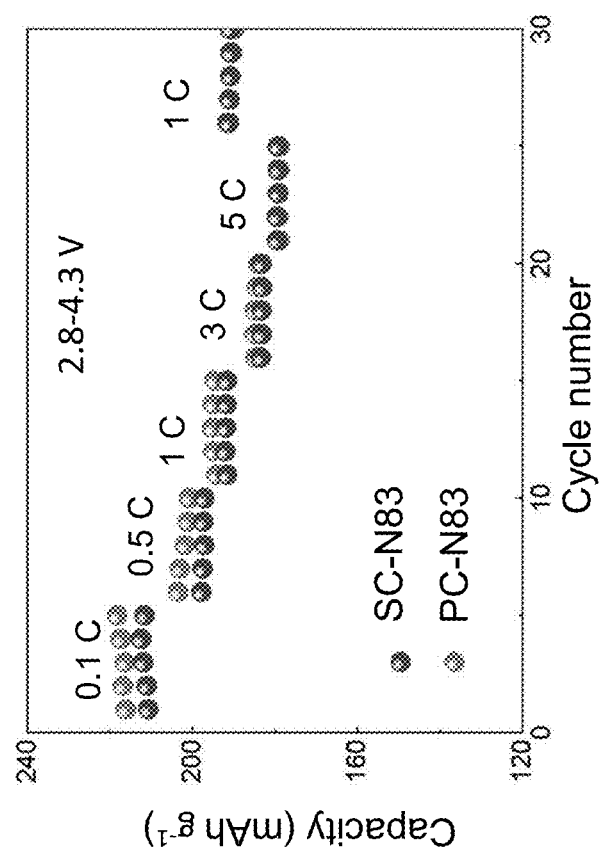

The rate capabilities of PC- and SC-N83 are compared with current density varying from 0.1 to 5 C (FIG. 3e). Although the capacity of SC-N83 is slightly lower than that of PC-N83 at C due to longer Li+ diffusion path, the capacity gap decreases as the current density increases. When reaching 5 C, the capacities of SC- and PC-N83 cathodes turn out to be comparable.

Figure 3F:
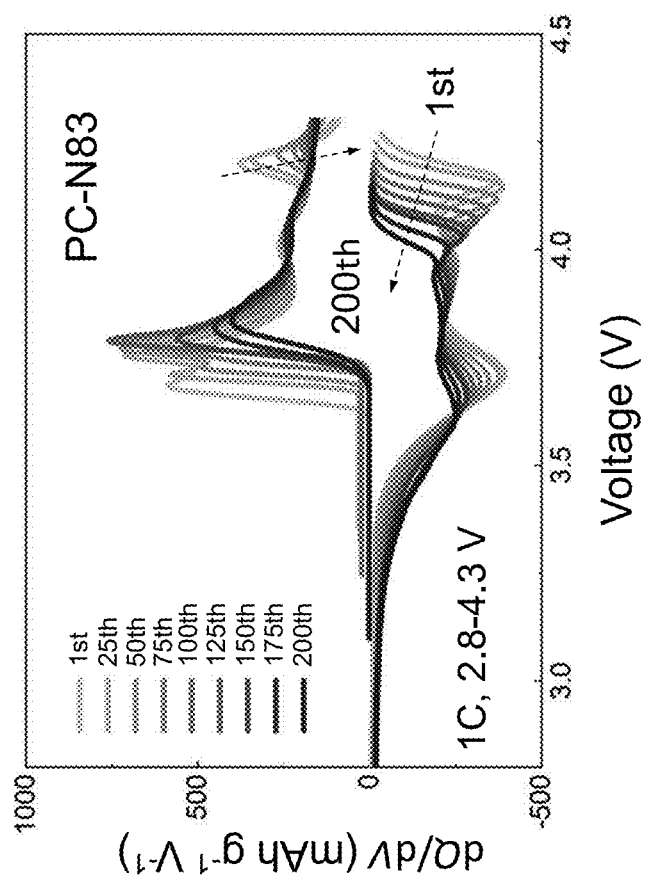
Figure 3G:
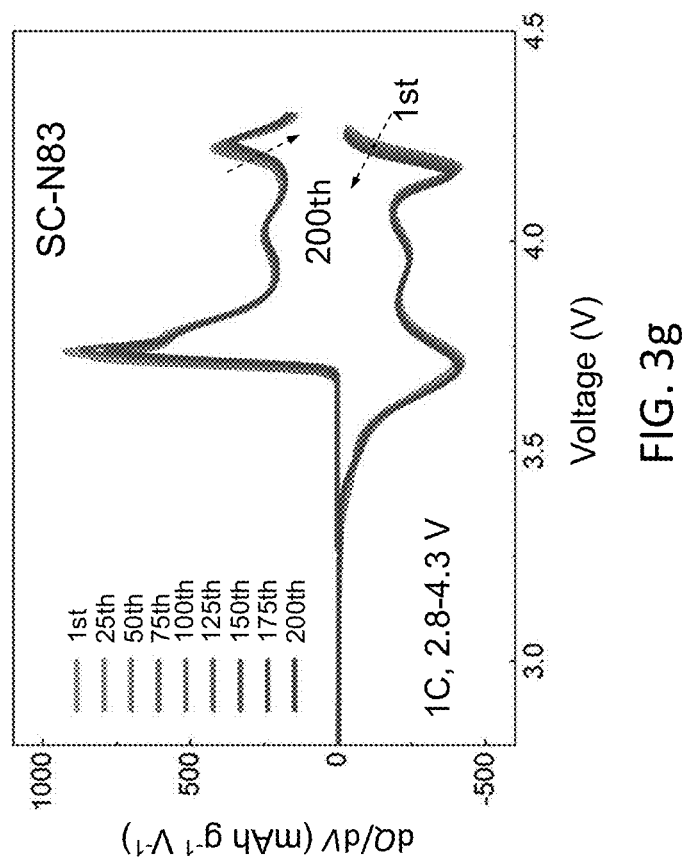
Figure 3H:
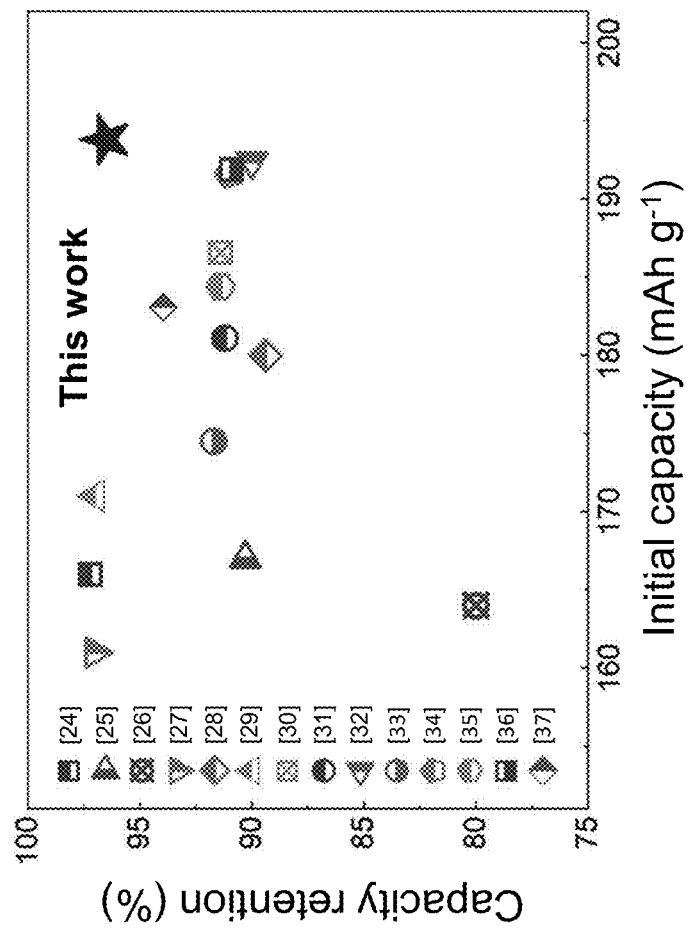
Figure 9B:
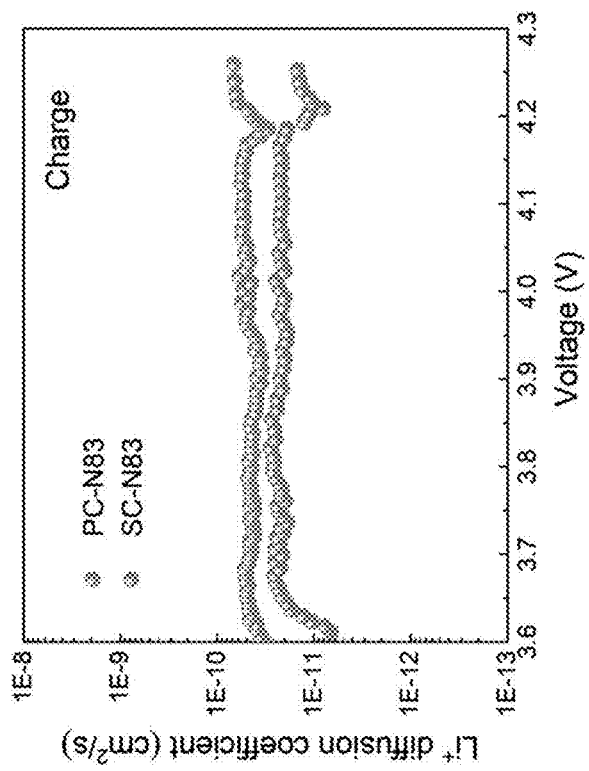
Figure 9C:
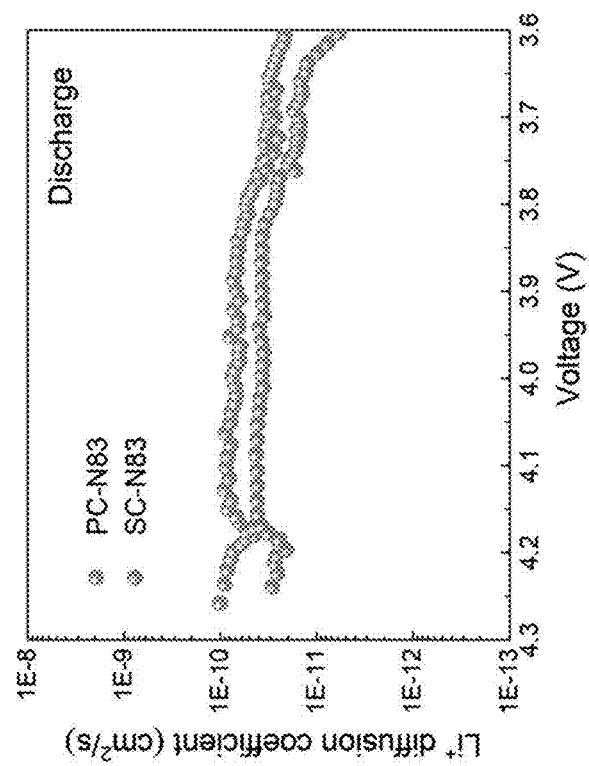

The galvanostatic intermittent titration technique (GITT) was performed to evaluate the Li transportation in both SC- and PC-N83 cathodes (FIG. 9). The results reveal that the PC-N83 shows a slightly higher Li diffusion coefficient than that of SC-N83, which could be due to the shorter Li diffusion pathway in the polycrystalline particles. FIGS. 3f, 3g plot the differential capacity (dQ/dV) curves measured at different cycles for PC-N83 and SC-N83, respectively. For PC-N83, an increased polarization and weakened characteristic peaks could be observed upon cycling, whereas those of the SC-N83 are stable. This further validates the inhibited mechanical fractures in the single-crystal sample. As depicted in FIG. 3h, the performance of the SC-N83 formed according to the present invention is comparable to the best single-crystal NCM cathodes considering both the initial capacity and the capacity retention cycled at 1 C.

4. High-Energy Synchrotron XRD Measurement

Figure 4A:
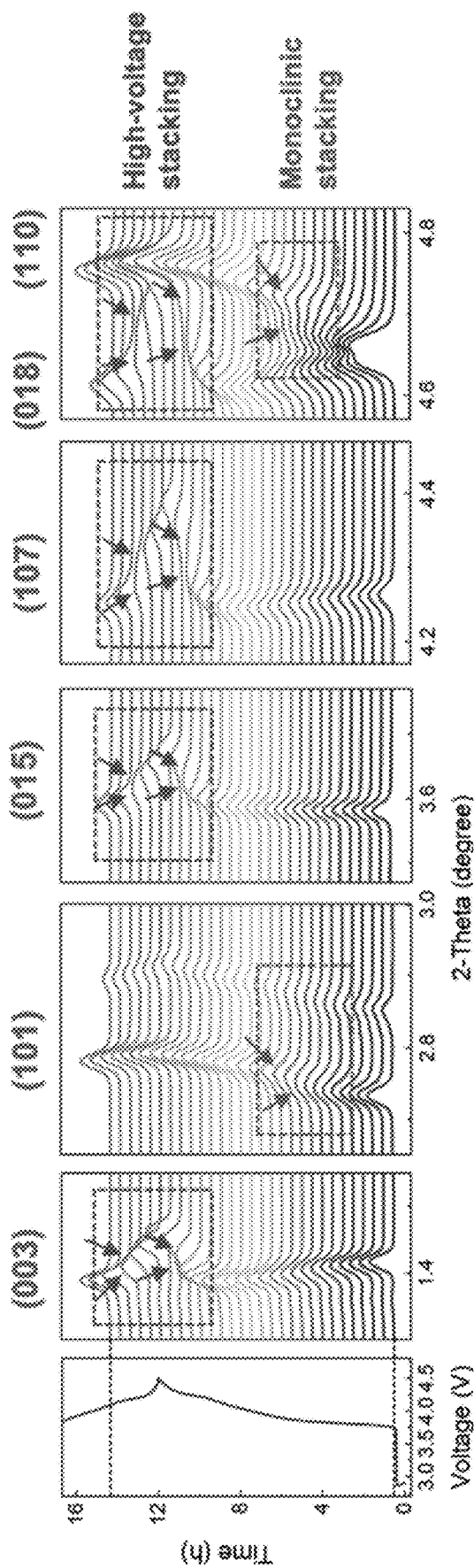
FIGS. 4a-4d show in-situ synchrotron XRD analysis. (4a) shows stacked profiles of the in situ XRD pattern along with the corresponding voltage profile of the SCN83 cathode. The red dotted boxes (arrows) and the blue dotted boxes (arrows) emphasize the peak splits of monoclinic phase and high-voltage stacking faults, respectively. (4b) shows schematic diagrams of Li sublattices corresponding to the hexagonal R-3m and monoclinic C2/m phases. (4c) shows unit cells of the hexagonal R-3m and monoclinic C2/m phases. (4d) shows lattice evolutions of a- and c-axes fitted from the in situ XRD patterns. The green area shows the monoclinic phase upon charging, whereas the yellow area shows the stacking faults within the high-voltage H3 phase.
Figure 4B:
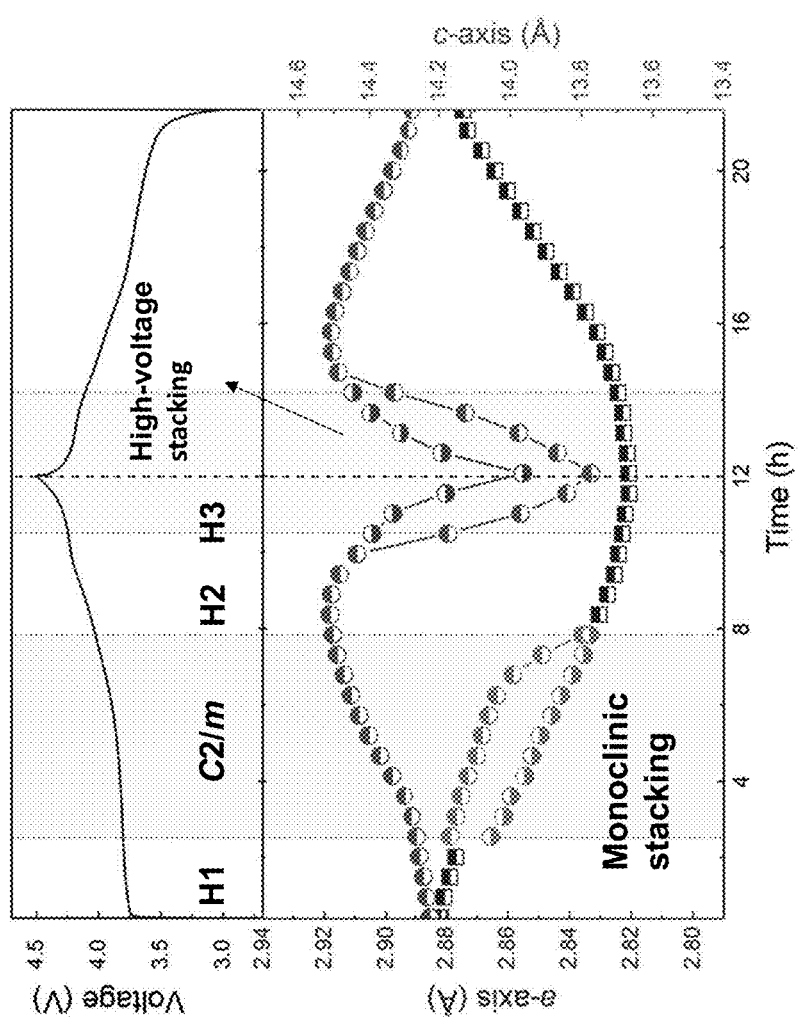
Figure 4C:
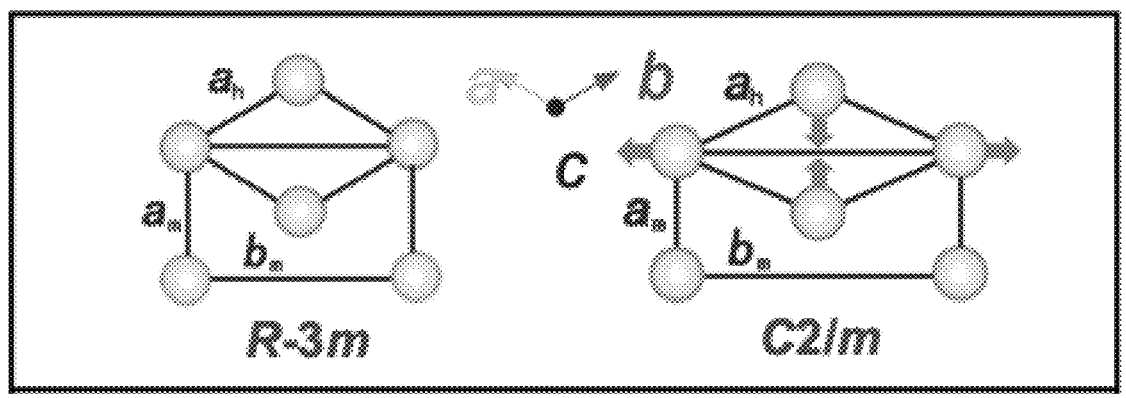
Figure 4D:
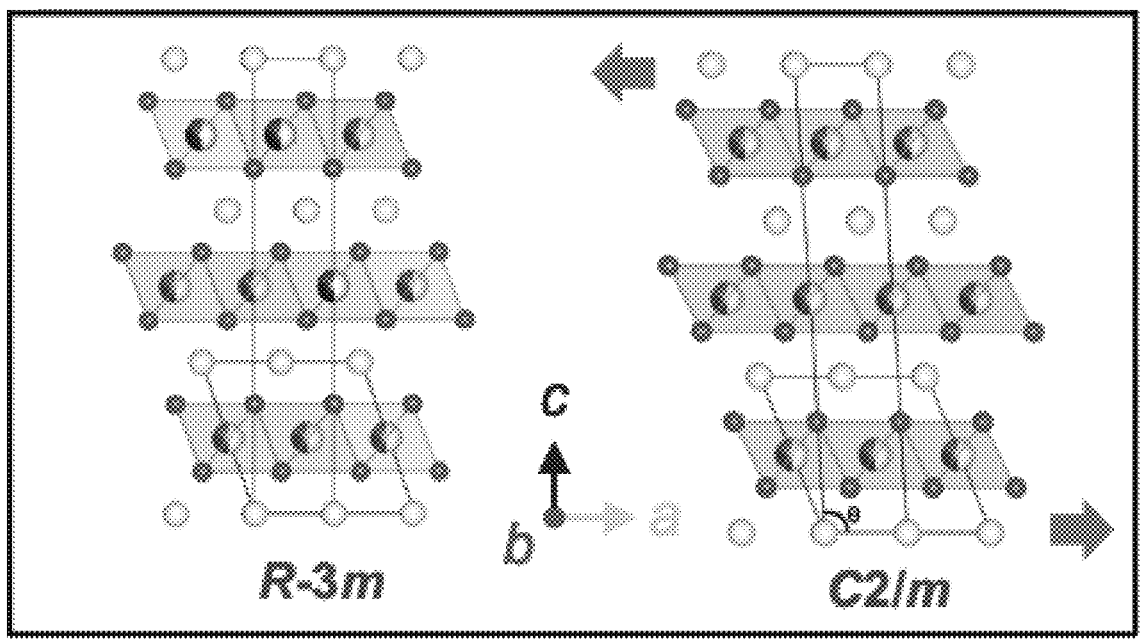
Figure 10:
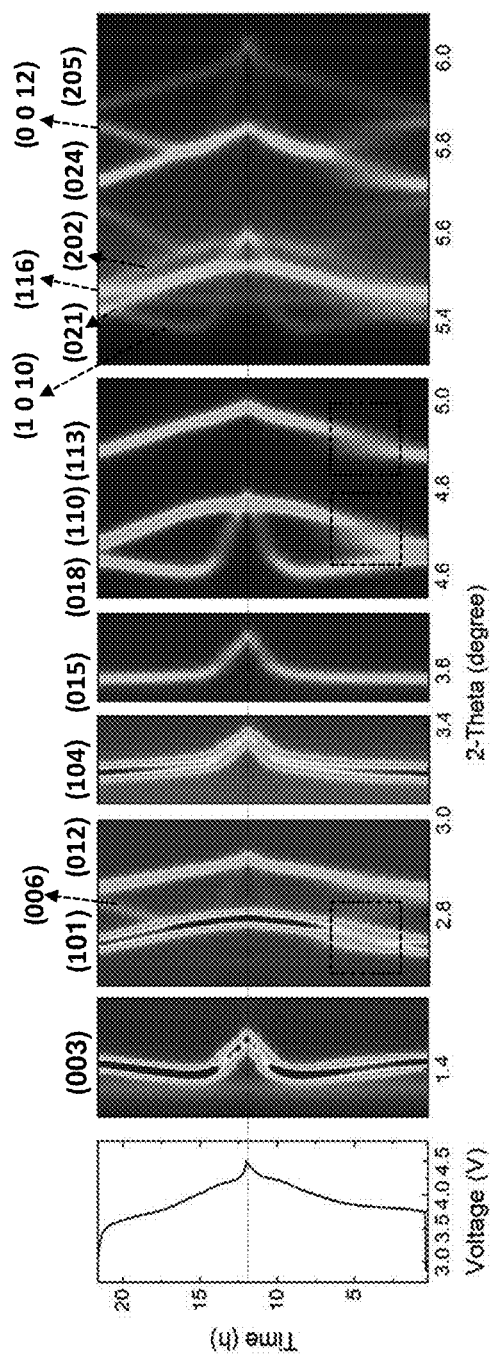
FIG. 10 shows contour plots of in situ XRD pattern for the SC-N83 cathode coupled with the voltage profile. The yellow dotted boxes frame the peak splits that fingerprint the monoclinic phase.

To clarify the Li-intercalation kinetics in the single crystals of the invention, in situ high-energy synchrotron XRD measurement, capable of characterizing structural dynamics during operation, was conducted upon the initial cycle. The stacked peak profiles along with the charge-discharge curve have been presented in FIG. 4a (see contour plot in FIG. 10). Below 3.7 V, all of the peaks emerging at the R-3m Bragg positions are singlets. When charging to 3.7-3.9 V, while the c-orientated peaks, such as (003), (015), (107), and (108), evolve continuously, the peaks of (101) and (110) exhibit an obvious splitting feature. This result indicates a phase transition from hexagonal R-3m (H1) to monoclinic C2/m (M), where the crystallographic isotropy along a-/b-direction is broken (as depicted by the Li-sublattice in FIG. 4b). Therefore, a disparate unit cell is required to describe the monoclinic structure (FIG. 4c). Upon further charging, the doublets of (101) and (110) merge back into singlets, fingerprinting the occurrence of the monoclinic (M)-to-hexagonal (H2) transition. As the voltage reaches to ~4.1-4.2 V, all of the c-orientated peaks shift toward higher angles, which is an indicator of the H2-H3 transition. Accompanied with the peak shifting, remarkably, these peaks also exhibit clear splits. This implies the layered stack of H3 is not regular with two interlayer distances in the lattice. The lattice parameters at variable voltages were extracted by fitting the in situ XRD data (FIG. 4d). The typical R-3m model was adopted below 3.7 V. At this stage, the SC-N83 undergoes a contraction along the a-axis and an expansion along the c-axis. The a-contraction can be explained by the decreased ionic radii of oxidized TMs, whereas the c-expansion is driven by the weakened screen effect of O—O repulsion along with Li+ deintercalation.

Upon further charging to 3.7-3.9 V, the C2/m model was employed to describe the splits of the ab-orientated peaks like (101) and (110). To ensure the evolutive continuity, the extracted monoclinic lattice parameters were transformed into hexagonal ones according to their crystallographic relationships (i.e., $a_{mon}=\sqrt{3}a_{hex}$, $b_{mon}=a_{hex}$, $c_{mon}=c_{hex}/(3 \sin \beta)$, $\beta=180 \tan-1(c_{hex}/\sqrt{3}a_{hex})$). The results show that the degenerate a-/b-axis in the H1 phase turns to be anisotropic in the M phase, meanwhile the c-axis in terms of R-3m unit block evolves continuously during the H1-M-H2 transition. When deeply charged (>4.1 V), while the a-axis continues to contract steadily, the length of c-axis drops rapidly, which is related to the H2-H3 transition. Remarkably, two distinct c-values could be determined within the H3 region. Given the morphological feature of the single crystals, this phenomenon could be described by the coexistence of multiple interlayer distances derived from variable surface-to-core lithiation states (discussed later).

Figure 5A:
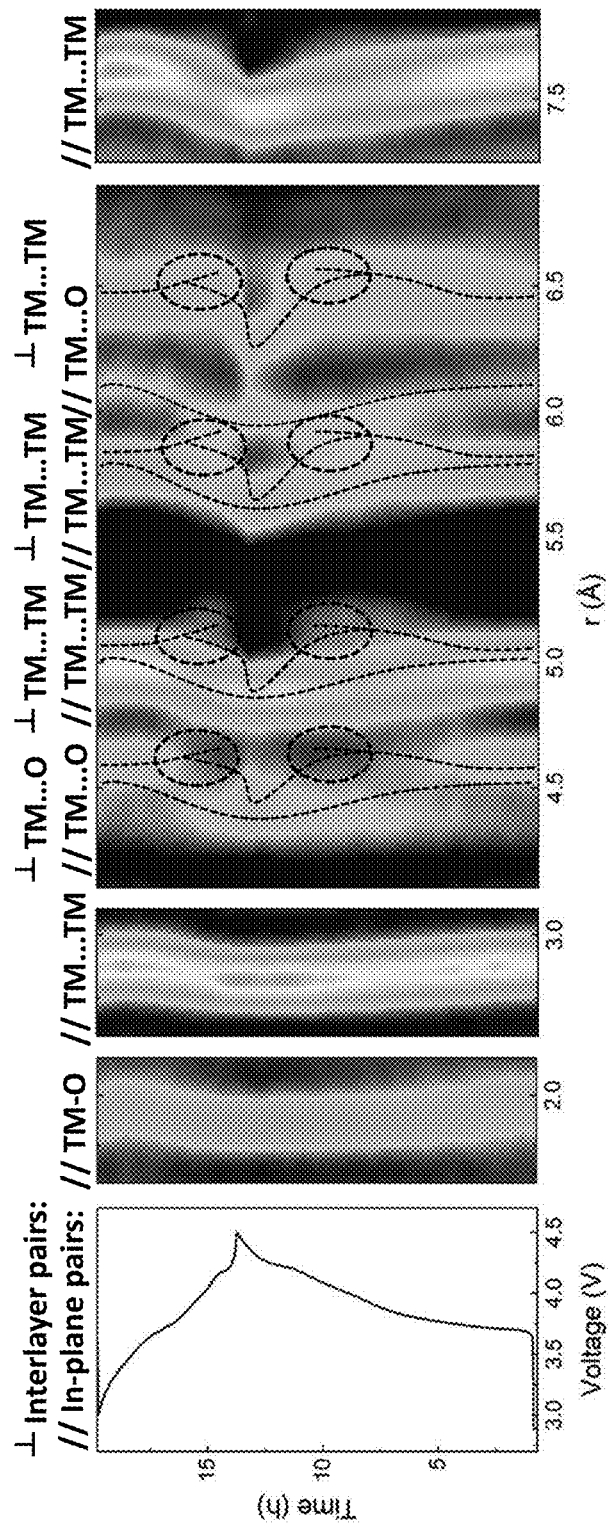
FIGS. 5a-5e show in-situ synchrotron PDF analysis. (5a) shows Contour plots of the low-r PDF peaks for the SC-N83 cathode coupled with the corresponding voltage profile. The red and green dashed lines indicate the in-plane and interlayer atom pairs, respectively. (5b) shows stacked plots of the first two peaks at selected voltages. The blue and yellow dashed lines show the splits of the TM-O peaks. (5c and 5d) are full-profile refinement patterns for the SC-N83 charged at (5c) 3.68 V and (5d) 3.73 V adopting R3-m and C2/m structural models, respectively. (5e) is a schematic map of the local structural evolution from R-3m to C2/m phase revealed by PDF refinements.
Figure 5B:
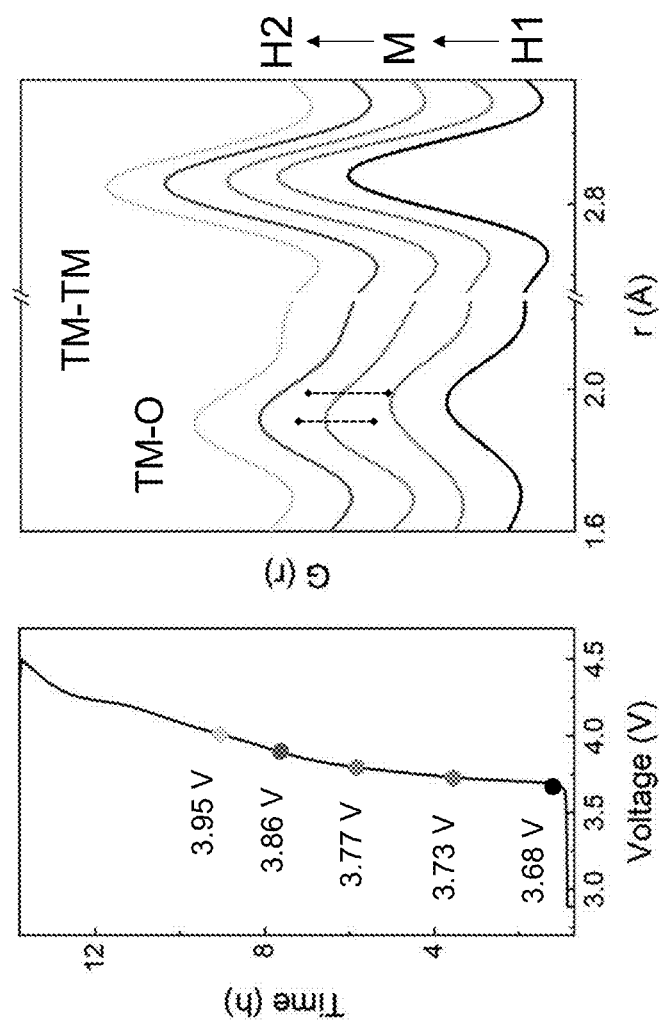
Figure 5C:
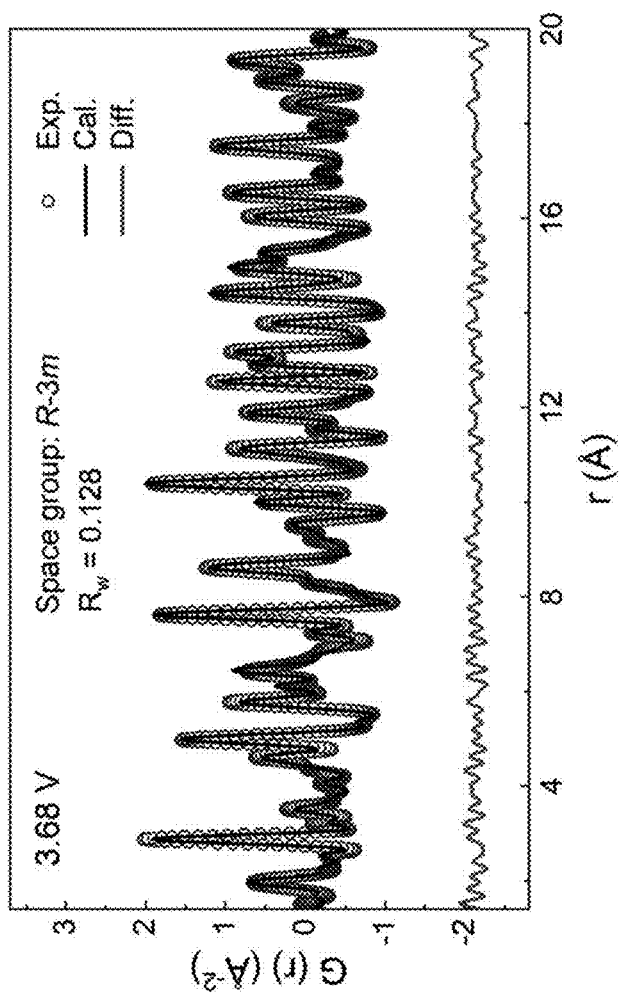
Figure 5D:
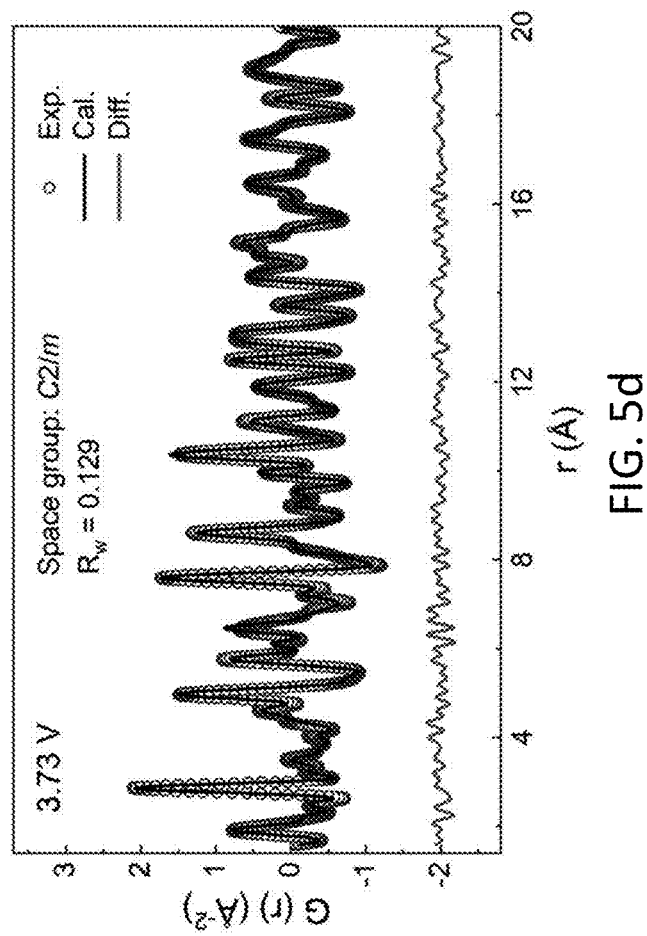
Figure 5E:
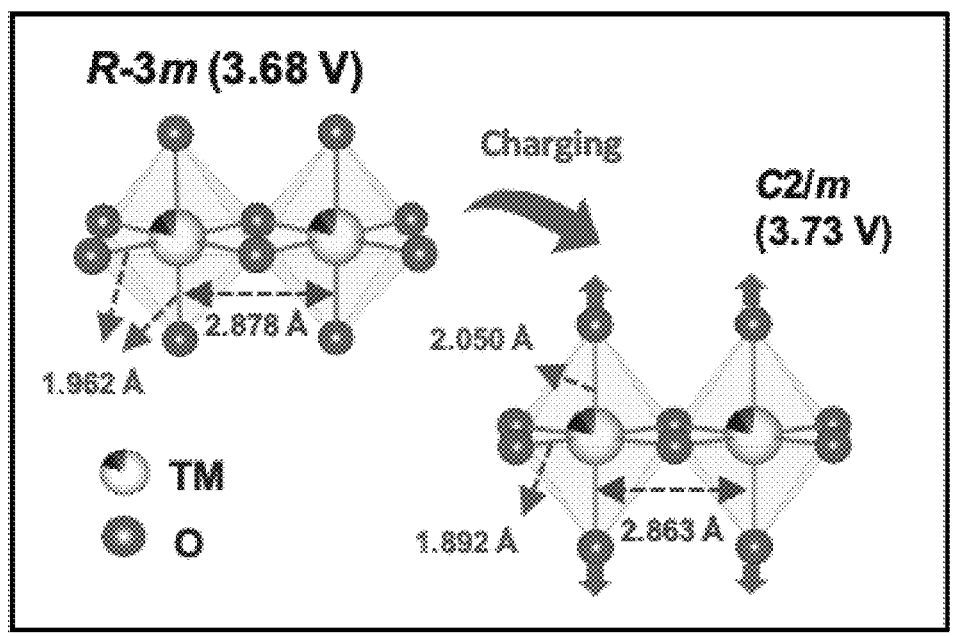
Figures 11A, 11B:
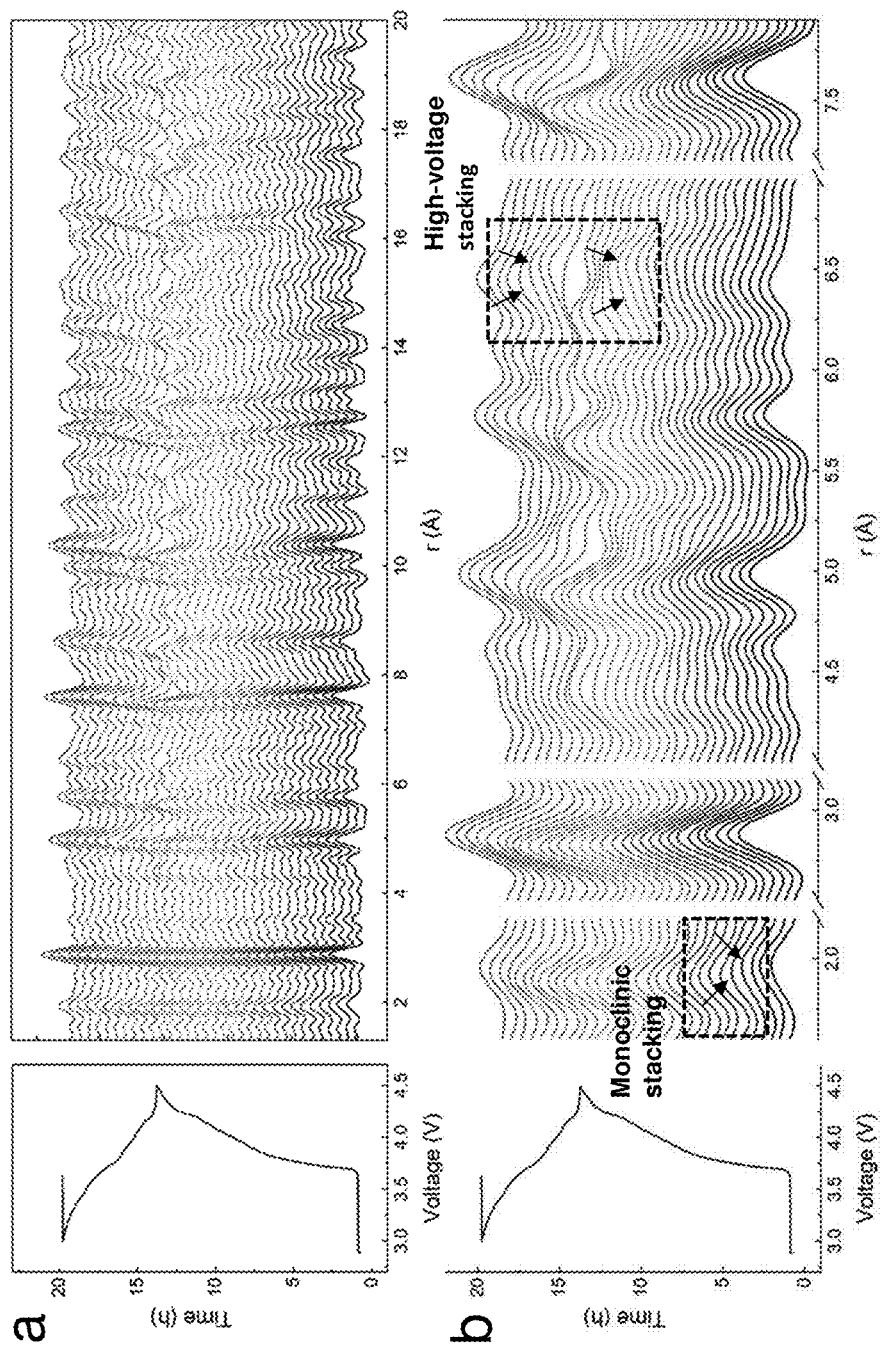
FIG. 11a-11b show (11a) Stacked plots of in situ PDF patterns for SC-N83 cathode coupled with the corresponding voltage profile within one charge-discharge cycle. (11b) shows stacked profiles of low-r PDF peaks within the initial charge-discharge process. The red box and arrows show the first-shell split of the monoclinic phase, while the blue box and arrows indicate the high-voltage stacking faults across the interlayers.

In situ synchrotron PDF analysis, as a short-range probe compensatory to in situ XRD was carried out to further encode the local structural change in the SC-N83. FIG. 5a presents the contour plots of the low-r PDF peaks coupled with the corresponding voltage profile, while the stacked full range and low-r peak profiles are plotted in FIG. 11a, 11b. Analogous to the powder PDF pattern (FIG. 1c), the first two peaks lying below 3.0 Å could be associated with the octahedral TM-O and the nearest TM . . . TM atom pairs, respectively. These two features, as well as all of the in-plane distances (i.e., distances within the $TMO_2$ layers) marked in FIG. 5a, show a contraction upon charging and an expansion upon discharging, which agrees well with the in situ XRD results of a/b evolutions (see FIG. 4d). Notably, the first peak becomes an asymmetric doublet upon charging to 3.7-3.9 V, in contrast with the symmetric single peaks when the voltages are below 3.7 V or above 3.9 V (FIG. 5b and FIG. 11b). This means the regular octahedra with 6-fold TM-O bonds are distorted in the voltage range of 3.7-3.9 V, which will lower the crystallographic symmetry from R-3m to C2/m. As a result, we refined the PDF pattern before the transition with the R-3m model (FIG. 5c) while adopting the C2/m model for the pattern after the transition (FIG. 5d). As expected, both of the models can describe their relative patterns well with satisfactory agreement factors (Rw~0.13), which further proves the monoclinic phase and the H1-M-H2 transition in the SC-N83. On the basis of the refinement results (FIG. 5e), the 6-fold TM-O bonds (1.962 Å) in the R-3m phase (3.68 V) split into 2-fold longer bonds (2.050 Å) and 4-fold shorter bonds (1.892 Å) in the M phase (3.73 V). Meanwhile, due to the TM oxidation upon charging, the nearest TM . . . TM distance of edge-shared octahedra contracts from 2.878 to 2.863 Å. These results reveal an elongated octahedral geometry in the monoclinic structure. When the r distance reaches ~4.6 Å, the first interlayer atom pair (i.e., TM . . . O) starts to appear in the G(r) pattern, whereas the other three interlayer peaks visible in the low-r region emerge at ~5.1, ~5.8, and ~6.5 Å (marked with green dashed lines in FIG. 5a). From the contour plot, all of these interlayer interactions show an expansion upon initial charging followed by a sharp contraction upon deeply charging, which accords well with the evolution trend of the c-axis.

Consistent with the in situ XRD results, notably, obvious splits could be also observed for all of the interlayer peaks at high voltage (FIG. 5a and FIG. 10b). This provides additional evidence of the multiple interlayer distances in the H3 phase of the SC-N83. The H1-M-H2 transition behavior observed in the present SC-N83 is similar to that of $LiNiO_2$, where the monoclinic phase is triggered by the rearrangement of Li/vacancy ordering (so-called order-disorder transition). For the polycrystalline Ni-rich NCMs, although reflected by weak dQ/dV features this monoclinic phase has been hardly tracked by structural characterizations. Instead, a direct H1-to-H2 transition with an H1-H2 coexisting region was frequently observed from in situ XRD data. The coexistence of H1 and H2 phases inevitably induces lattice mismatch and mechanical cracks across the phase boundaries. Dynamically, the absence of the monoclinic phase in the polycrystalline materials might be due to very fast kinetics of order-disorder transition, so the M phase cannot be easily captured by time resolved experiments. By contrast, the SC-N83 undergoes an H1-M-H2 transition with the intermediate M phase. A recent study reveals that the single-crystal Ni-rich cathode shows a sluggish ionic kinetics at low SOC that covers the order-disorder transition. Therefore, the appearance of the intermediate M phase might be triggered by the slow rate of Li transport at low SOC, which could significantly reduce the lattice strains from H1 to H2 and therefore act as an important contributor to the high durability of the SC-N83 cathode.

Figures 12A, 12B:
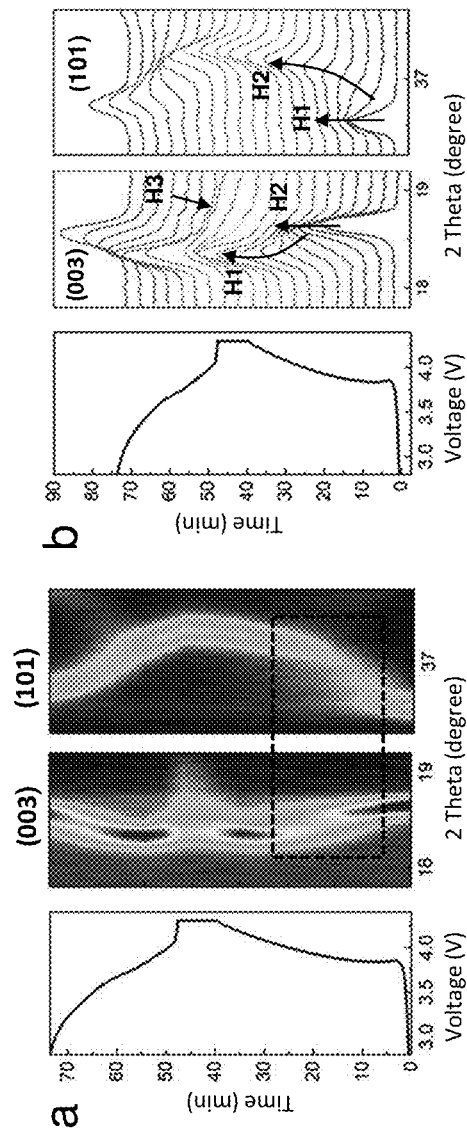
FIGS. 12a-12b show (12a) a contour plot and (12b) a stacked plot of in situ XRD measurement with the corresponding charge-discharge profile at a high rate of 2 C on the SC-N83 cathode. The yellow dashed box in (12a) emphasizes the coexistence region of H1 and H2 upon charging.

To support this speculation, in situ XRD measurement at a high rate of 2C was conducted on the SC-N83 cathode (FIG. 12). The results show that the SC-N83 exhibits direct H1-H2 transition without the monoclinic phase, which is very consistent with the idea that the detectable monoclinic phase is induced by slow kinetics of the order-disorder transition.

On the other hand, when deeply charged, SC-N83 exhibits irregular H3 stack with multiple interlayer distances, as clearly revealed by in situ XRD and in situ PDF measurements. This phenomenon suggests a gradient SOC induced by kinetic limitation, which may come from the large-size single-crystal morphology. Because of the long Li+ diffusion pathway in the single-crystal particles, the lithiation states from surface to core are surely different. Upon delithiation, while the outer-shell Li+ ions are first extracted from the single crystals, the Li+ located in the core area will migrate to the surface and compensate the surface lithium loss. In this regard, SOC segregation is expected from surface to core, which has been also reported in NCM cathodes and especially single-crystal cathodes. This SOC gap between surface and core grows as the delithiation goes forward, giving rise to two distinct c-values at the end of charge. The interlayer collapse during H2-H3 transition, which is a major concern for the Ni-rich NCM cathodes, is less profound in the surface. This stable surface layer in the SC-N83 particles could be regarded as a spontaneous strain buffer to reduce the mechanical stress between particles, which benefits the cycling stability of SC-N83. It is worth noting that the SOC variation in single crystals is heterogeneous and microscopic tools such as transmission X-ray microscope (TXM) can provide complementary insight into this interesting phenomenon.

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

The invention claimed is:

1. A method for preparing a high-performance single-crystal layered cathode material of formula $LiNi_xTM_{1-x}O_2$ (0.6<x<0.9, TM=one or more of Mn, Co, Fe, Zr, V, Ti) or formula $Na_{0.66}TMO_2$ (TM=one or more of Ni, Mn, Fe, Cr, and Co) comprising:
   mixing together stoichiometric amounts of transition-metal salts to form a transition metal salt solution;
   adding a precipitating agent to the transition metal salt solution;
   co-precipitating a mixed transition metal precipitant;
   mixing the mixed transition metal precipitant with a lithium precursor or a sodium precursor to form a cathode material precursor mixture;

calcining the cathode material precursor mixture at a first temperature to form a first calcined material;

grinding the first calcined material;

calcining the first calcined material at a second temperature to form a second calcined material;

annealing the second calcined material at a third temperature to create single crystal layered cathode material particles.

2. The method of claim 1, further comprising washing, filtering, and drying the mixed transition metal precipitant.

3. The method of claim 1, wherein the lithium precursor is lithium hydroxide and the sodium precursor is sodium hydroxide.

4. The method of claim 1 where the precipitating agent is sodium hydroxide with a concentration of 4.0 mol $L^{-1}$ in an ammonium hydroxide solution having a concentration sufficient to obtain a pH approximately equal to 11.

5. The method of claim 1, wherein the concentration of the transition metal solution is approximately 2.0 mol $L^{-1}$.

6. The method of claim 1, wherein the transition-metal solution and the alkalis are added separately into a reaction vessel.

7. The method of claim 1, wherein cathode material is $LiNi_xTM_{1-x}O_2$ (0.6<x<0.9, TM=one or more of Mn, Co, Fe, Zr, V, Ti) and the transition metal precipitant is mixed with the lithium precursor at a molar ratio of 1.05:1.

8. The method of claim 1, wherein first temperature is within a temperature range of 400 to 600° C. and the second temperature is within a temperature range of 700-1000° C.

9. The method of claim 1, wherein the first calcining is performed for approximately 4-6 hours and the second calcining is performed for approximately 12-17 hours.

10. The method of claim 1, wherein grinding the first calcined material is performed with a ball mill at a speed of approximately 200 rpm $min^{-1}$ to 400 rpm $min^{-1}$ for approximately 2 to 4 hours.

11. The method of claim 1, wherein the third temperature is approximately 600 to 900° C. and an annealing time is approximately 8 to 12 hours.

12. The method of claim 1, wherein the calcining is performed in an oxygen-containing atmosphere.

13. The method of claim 1, wherein a particle size of the single crystal layered cathode material particles is in a range of 2-5 μm.

14. The method of claim 1, wherein the precipitating agent is one or more of sodium hydroxide or ammonium hydroxide.

* * * * *